United States Patent
Alam

(10) Patent No.: US 10,929,582 B2
(45) Date of Patent: Feb. 23, 2021

(54) CIRCUIT VALIDATION FOR CIRCUITS COMPRISING MULTIPLE POSSIBLE VARIANTS FOR INDIVIDUAL COMPONENTS

(71) Applicant: Mentor Graphics Corporation, Wilsonville, OR (US)

(72) Inventor: Michael Alam, Ottawa (CA)

(73) Assignee: Mentor Graphics Corporation, Wilsonville, OR (US)

( * ) Notice: Subject to any disclaimer, the term of this patent is extended or adjusted under 35 U.S.C. 154(b) by 225 days.

(21) Appl. No.: 16/089,408

(22) PCT Filed: Mar. 31, 2017

(86) PCT No.: PCT/US2017/025533
§ 371 (c)(1),
(2) Date: Sep. 28, 2018

(87) PCT Pub. No.: WO2017/173357
PCT Pub. Date: Oct. 5, 2017

(65) Prior Publication Data
US 2020/0302102 A1    Sep. 24, 2020

Related U.S. Application Data

(60) Provisional application No. 62/315,735, filed on Mar. 31, 2016.

(51) Int. Cl.
*G06F 30/33* (2020.01)
*G06F 30/367* (2020.01)
*G06F 30/347* (2020.01)
*G06F 30/333* (2020.01)
*G06F 11/26* (2006.01)

(52) U.S. Cl.
CPC ........... *G06F 30/33* (2020.01); *G06F 11/261* (2013.01); *G06F 30/333* (2020.01); *G06F 30/347* (2020.01); *G06F 30/367* (2020.01)

(58) Field of Classification Search
CPC ...... G06F 11/261; G06F 30/33; G06F 30/333; G06F 30/367; G06F 30/20; G06F 30/398
USPC ................................................ 716/106, 136
See application file for complete search history.

(56) References Cited

U.S. PATENT DOCUMENTS

| 5,692,160 | A | 11/1997 | Sarin |
| 6,035,115 | A | 3/2000 | Suzuki |
| 6,665,847 | B1 | 12/2003 | Maheshwari |

(Continued)

OTHER PUBLICATIONS

Michael Kaergel et al, "Simulation Based Verification with Range Based Signal Representations for Mixed-Signal Systems", Integrated Circuits and Systems Design, ACM, NY, USA, Sep. 1, 2014, pp. 1-7.

(Continued)

*Primary Examiner* — Paul Dinh

(57) ABSTRACT

Circuits may be designed using computer aided design tools and may comprise a plurality of different possible variants of individual components. These multi-variant component circuits may be validated to identify potential problems by generating an aggregate parametric model for the multi-variant components and then using the aggregate parametric model in applying tests to different connection networks of the circuit definition.

21 Claims, 4 Drawing Sheets

(56) References Cited

U.S. PATENT DOCUMENTS

2013/0047133 A1\* 2/2013 Alam .................. G06F 30/33
716/136

OTHER PUBLICATIONS

Vivek S. Nanakumar et al., "Statistical static timing analysis flow for transistor level macros in a microprocessor", Quality Electronic Design (ISQED), 2010 11th International Symposium on, IEEE, Pisataway, NJ, USA, Mar. 22, 2010, pp. 163-170.
From Wikipedia: "7400 series", Retrieved from the Internet: URL:https://en.wikipedia.org/api/rest_v1/page/pdf/7400_series, Mar. 21, 20016.
PCT International Search Report and Written Opinion dated Jul. 24, 2017 corresponding to PCT Application No. PCT/US2017/025533 filed Mar. 31, 2017.
Nuno Lourenço et al., "GENOM-POF: Multi-Objective Evolutionary Synthesis of Analog ICs with Corners Validation", Genetic and Evolutionary Computation, ACM, 2 Penn Plaza, Suite 701 New York NY 10121-0701 USA, Jul. 7, 2012, pp. 1119-1126.

\* cited by examiner

CIRCUIT VALIDATION FOR CIRCUITS COMPRISING MULTIPLE POSSIBLE VARIANTS FOR INDIVIDUAL COMPONENTS

RELATED APPLICATIONS

This application claims the benefit of priority to U.S. Provisional Application 62/315,735 file Mar. 31, 2016.

TECHNICAL FIELD

The current disclosure relates to systems and methods for validating circuits, and in particular to systems and methods for validating circuits having components with multiple possible variants.

BACKGROUND

A circuit is an electrical network of components. A circuit may include complex digital circuits comprising tens, hundreds, thousands or more of interconnected components. The components of circuits may comprise a single discrete electrical component such as a resistor, capacitor, inductor, diode, transistor etc. The components may also include other circuits providing more complex electrical components such as an operational amplifier, a voltage regulator, a shift register, an arithmetic logic unit, a microcontroller, a microprocessor, etc. Complex functionality can be provided by connecting a plurality of components together in various manners.

Complex electrical circuits are designed using various computer programs that allow the complexity of components to be abstracted from the view of the designer. While such design tools enable the design of complex electrical circuits and simplify the process, the design tools may also make debugging the large complex circuits difficult as the particular connections between various interacting components, as well as the particular requirements of components, may also be abstracted and/or obscured from the designer's view.

The specific connections of components for a circuit may be defined in numerous fashions. One such definition is called a netlist which specifies a plurality of nets, each of which indicates components, or more particularly ports, or pins, of components, that are connected together. Each component specified in a net may be identified by a reference, and the specific component associated with the reference can be specified separately, typically in a Bill of Materials (BOM).

A circuit design may be tested within computer aided design tools in order to identify potential issues with the circuit's design prior to manufacturing the circuit. Identifying potential issues as early as possible in a circuits design is desirable as it may be easier, and/or less costly to correct possible issues earlier in the design process. Complex circuits may be designed with different variants of components as part of the design. For example, a particular component may be provided by different manufacturers. While the different components may have the same overall characteristics, operating details may vary. If numerous components in a circuit design each have a number of possible variants, testing all possible combinations of variants may be time consuming.

SUMMARY

In accordance with the present disclosure there is provided a method for use in validating a circuit design, the method comprising: receiving a circuit definition comprising a plurality of circuit components connected together by a plurality of connection networks (nets), one or more of the plurality of circuit components comprising a plurality of different possible variants, each of the variants associated with a parametric model specifying at least one operating parameter of the variant; for each circuit component comprising a plurality of possible variants generating an aggregate parametric model comprising a range of values for the at least one operating parameter based on the parametric models of the plurality of possible variants; and applying one or more circuit test to one or more of the nets based on the aggregate parametric model.

In accordance with the present disclosure there is further provided a system for implementing the method for use in validating a circuit design.

In accordance with the present disclosure there is further provided a system for validating a circuit design, the system comprising a memory for storing instructions; and a processor for executing the instructions, which when executed configure the system to carry out a method comprising: accessing a circuit definition of the electronic circuit design stored in memory of the computing system, the circuit definition comprising: connection network definitions of a plurality of circuit components with respective pins connected together; and indications of one or more electronic components providing each circuit component, each of the electronic components associated with an existing parametric model comprising at least one operating parameter and associated operating parameter value of the respective electronic component; identifying as multi-variant circuit components those circuit components within the circuit definition that are provided by a plurality of possible variant electronic components; for each multi-variant component generating an aggregate parametric model for the multi-variant component from the respective parametric models associated with each of the plurality of possible variant electronic components; retrieving one or more circuit tests to apply to the circuit definition, each of the circuit tests defining operating parameters used by the respective circuit test; and applying the one or more circuit tests using operating parameter values from aggregate parametric models for multi-variant components or operating parameter values from parametric models for circuit components.

In a further embodiment of the system, at least one of the one or more applied circuit tests identifies at least one potential issue in the circuit design, the memory storing instructions for further configuring the system to display results of applying the one or more circuit tests including the at least one identified potential issue in the circuit design.

In a further embodiment, the system further comprises a computer display and the results are displayed within a circuit design tool displayed on the computer display.

In a further embodiment of the system, generating each of the aggregate parametric models for the multi-variant components comprises combining operating parameter values from the respective parametric models of each of the plurality of possible variant electronic components of the respective multi-variant components together into a range of operating parameter values.

In a further embodiment of the system, combining operating parameter values together so that the highest operating parameter value of the plurality of respective parametric models is the highest operating parameter value of the operating parameter value range of the aggregate parametric model and the lowest operating parameter value of the plurality of respective parametric models is the lowest operating parameter value of the operating parameter value range of the aggregate parametric model.

In a further embodiment of the system, combining operating parameter values together so that the operating parameter value range of the aggregate parametric model comprises a range of common operating parameter values common to the plurality of respective parametric models.

In a further embodiment of the system, applying the one or more circuit tests comprises: selecting the operating parameter value to use in applying the respective test from the operating parameter value range of aggregate parametric model for multi-variant components.

In a further embodiment of the system, the one or more circuit tests provide an indication of an operating parameter value to select from the operating parameter value range.

In a further embodiment of the system, the indication of the operating parameter value is either the highest value of the operating parameter value range or the lowest value of the operating parameter value range.

In a further embodiment of the system, retrieving and applying the circuit tests to the circuit definition comprises retrieving and applying one or more circuit test to apply to each of the connection networks of the circuit definition.

In accordance with the present disclosure there is further provided a method for use in validating an electronic circuit design, the method implemented by a computing system and comprising: accessing a circuit definition of the electronic circuit design stored in memory of the computing system, the circuit definition comprising: connection network definitions of a plurality of circuit components with respective pins connected together; and indications of one or more electronic components providing each circuit component, each of the electronic components associated with an existing parametric model comprising at least one operating parameter and associated operating parameter value of the respective electronic component; identifying as multi-variant circuit components those circuit components within the circuit definition that are provided by a plurality of possible variant electronic components; for each multi-variant component generating an aggregate parametric model for the multi-variant component from the respective parametric models associated with each of the plurality of possible variant electronic components; retrieving one or more circuit tests to apply to the circuit definition, each of the circuit tests defining operating parameters used by the respective circuit test; and applying the one or more circuit tests using operating parameter values from aggregate parametric models for multi-variant components or operating parameter values from parametric models for circuit components.

In a further embodiment of the method, at least one of the one or more applied circuit tests identifies at least one potential issue in the circuit design, and the method further comprises displaying results of applying the one or more circuit tests including the at least one identified potential issue in the circuit design.

In a further embodiment of the method, the results are displayed within a circuit design tool displayed on a computer display.

In a further embodiment of the method, generating each of the aggregate parametric models for the multi-variant components comprises combining operating parameter values from the respective parametric models of each of the plurality of possible variant electronic components of the respective multi-variant components together into a range of operating parameter values.

In a further embodiment of the method, combining operating parameter values together so that the highest operating parameter value of the plurality of respective parametric models is the highest operating parameter value of the operating parameter value range of the aggregate parametric model and the lowest operating parameter value of the plurality of respective parametric models is the lowest operating parameter value of the operating parameter value range of the aggregate parametric model.

In a further embodiment of the method, combining operating parameter values together so that the operating parameter value range of the aggregate parametric model comprises a range of common operating parameter values common to the plurality of respective parametric models.

In a further embodiment of the method, applying the one or more circuit tests comprises: selecting the operating parameter value to use in applying the respective test from the operating parameter value range of aggregate parametric model for multi-variant components.

In a further embodiment of the method, the one or more circuit tests provide an indication of an operating parameter value to select from the operating parameter value range.

In a further embodiment of the method, the indication of the operating parameter value is either the highest value of the operating parameter value range or the lowest value of the operating parameter value range.

In a further embodiment of the method, retrieving and applying the circuit tests to the circuit definition comprises retrieving and applying one or more circuit test to apply to each of the connection networks of the circuit definition.

In accordance with the present disclosure there is further provided a non-transitory computer-readable medium storing a computer program product for use in generating an error report for validation of a test circuit, the computer program product comprising instructions, which when executed by a processor configure a computing system to carry out a method comprising: accessing a circuit definition of the electronic circuit design stored in memory of the computing system, the circuit definition comprising: connection network definitions of a plurality of circuit components with respective pins connected together; and indications of one or more electronic components providing each circuit component, each of the electronic components associated with an existing parametric model comprising at least one operating parameter and associated operating parameter value of the respective electronic component; identifying as multi-variant circuit components those circuit components within the circuit definition that are provided by a plurality of possible variant electronic components; for each multi-variant component generating an aggregate parametric model for the multi-variant component from the respective parametric models associated with each of the plurality of possible variant electronic components; retrieving one or more circuit tests to apply to the circuit definition, each of the circuit tests defining operating parameters used by the respective circuit test; and applying the one or more circuit tests using operating parameter values from aggregate parametric models for multi-variant components or operating parameter values from parametric models for circuit components.

BRIEF DESCRIPTION OF THE DRAWINGS

Embodiments are described herein with references to the appended drawings, in which.

DETAILED DESCRIPTION

Figure 1:
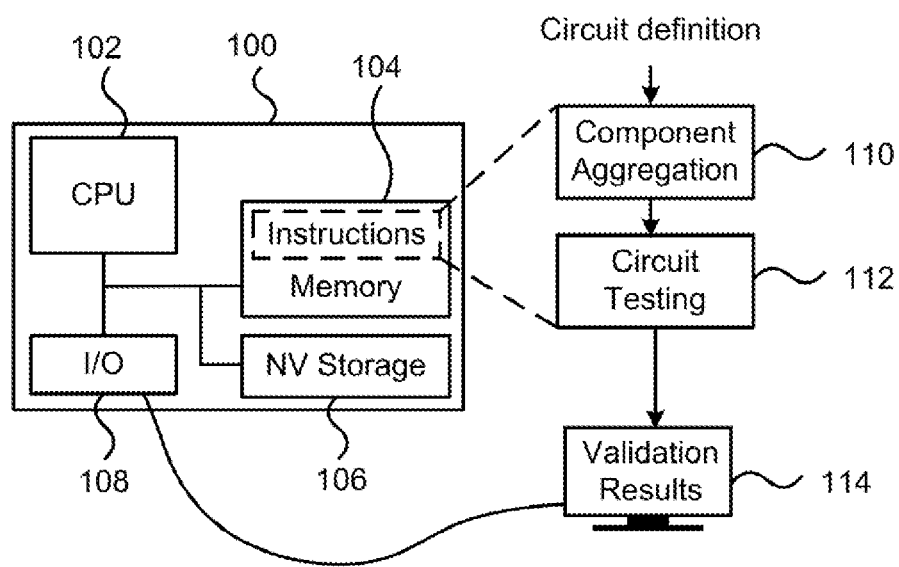
FIG. 1 depicts a system for validating a circuit comprising a plurality of different component variants.

Current circuit design comprises connecting a plurality of components together. The circuit components may be active components or passive components. Each active or passive component used in circuit designs has several operating parameters which must be observed to ensure that safe and proper operation can be achieved. Failure to take these operating parameters into consideration can cause both hard and/or intermittent failures which can be very difficult to diagnose. In a simple circuit involving few components, it may be a simple process to debug as there are very few connections to analyze. However circuit designs may be large and extremely complex with thousands of components and thousands of interconnections, each possibly having several pins connected to it. The computer tools used in designing these circuits may obscure individual connections and/or components, for example by grouping connections and or components together, in order to simplify the design process. Further, the circuit design may include multiple possible variants of different components that could be used. The different variants of the same component may provide the same functionality, but may have different operating characteristics or requirements. As a simple example, one variant of a component may have a minimum input voltage of 1.0 Volts, while a second variant of the same component has a minimum input voltage of 1.2 Volts. Although the different components provide the same functionality, the different operating characteristics may result in problems with the circuit when using one variant of the component, while working properly with a second variant of the component. If the above example component is provided with 1.1 Volts as an input voltage, the circuit may function as expected using the first component variant, since the supplied voltage is above the components minimum voltage of 1.0 Volts; however, if 1.1 Volts is input to the second component variant it may not function properly as the supplied voltage is below the component's minimum input voltage.

As the number of multi-variant components increases the number of alternative possible circuit designs that would each need to be tested in order to verify the correct operation may become unmanageably large, even when using computer design tools. As described further below, a circuit definition that has one or more components that have multi-variant options may first be processed in order to identify the multi-variant components and generate corresponding aggregate component models, which may then be used in applying circuit tests to the various connection networks of the circuit design. The aggregate component models generated for the multi-variant components allows a single application of a circuit test to be applied to identify potential problems with the different variants of the components.

The system 100 comprises a processing device 102, which may be provided by a central processing unit (CPU), controller or other devices that execute instructions, and memory 104 connected to the processing device 102. The memory 104 may comprise random access memory (RAM) or other types of memory and may be provided separately from the processing device 102, as part of the processing device 102, or a combination thereof. The system 100 may further comprise a non-volatile storage device 106 for providing storage when the system 100 is powered off. The system 100 may further comprise an input/output (I/O) interface 108 for connecting other devices or components to the processor 102. For example, a computer display 114 and keyboard (not shown) may be connected to the system 100. Although described as a single physical device, the system may be provided by a plurality of interconnected components. For example, the system may be a distributed computer device.

The memory 104 stores instructions, that when executed by the processing device 102 configure the system 100 to provide component aggregation functionality 110 and circuit testing functionality 112 as described further herein. Although not depicted in FIG. 1, the memory 104 may also include instructions, that when executed by the processor configure the system to provide electronic circuit design tool functionality for designing the circuit. The component aggregation functionality 110 receives a circuit definition, which is assumed to include one or more components that have different possible variants, and generates an aggregate component model for each of the multi-variant components. The generated aggregate component model or models may be used by the circuit testing functionality 112. The circuit testing functionality 112 receives a definition of a circuit board design to be validated and processes the circuit definition in order to identify problems, or potential problems in the circuit definition. The circuit definition defines both how electrical components are connected together in the various connection networks as well as the particular electronic component or components that can be used as the connected components. The circuit testing functionality 112 may apply particular circuit tests to the different connection networks and then provide the validation test results comprising the identified problems or potential problems for presentation to a user, for example on the computer display 114. The results of applying the tests, including one or more of the identified potential issues may be displayed to the user in a number of ways, including visually highlighting portions of a circuit in which potential errors were detected. The display of errors may also be displayed to the user in a list of errors. The error list may group errors together to reduce the number of error messages displayed to the user. The validation results can be used to improve the design of the circuit board design.

The circuit testing functionality 110 may use parametric models of the individual electrical components present in the circuit definition in order to test the circuit design. The parametric models of the components may represent the individual components as a set of pins, each having a specific pin type and one or more parameters, such as maximum and minimum voltages, power ratings, or other parameters that may describe operating limitations or requirements of the components. When a component in a circuit design may be provided by one of a plurality of different variants, each variant may be considered as a separate component that would require separate testing. However, applying the circuit tests to different circuit versions using each individual variant of a component may be time consuming. Instead of generating separate circuit variations for each component variation and testing the resulting circuit, it is possible to generate an aggregate component model for the multi-variant components and use the generated aggregate component models for the tests. That is, the different variants of multi-variant component may be combined together and tested as a single component. The aggregate component models provide an aggregated range of the operating parameter values for the group of variants. The tests may then select the appropriate value of the range from the aggregated component model for the particular test being performed.

Using the above example for a multi-variant component with one variant having a minimum input voltage of 1.0 Volts and the other having a minimum input voltage of 1.2 Volts, the aggregate component model may provide the range of 1.0-1.2 volts for the minimum voltage operating parameter. A test that determines if a connected component can provide the required input voltage may select the maximum value of the range, that is 1.2 Volts and compare the value to the maximum output value of the connected component. If the maximum output voltage the connected component can provide is 1.1 Volts, the test will fail and the potential issue be identified, whereas if the connected component can provide an output voltage of 1.3 volts, the test may pass. Although the above example is trivial, it highlights the ability to apply a single test and identify potential problems in a plurality of individual components. If a circuit has a large number of components, each with a number of possible variants, the ability to quickly and easily test all variants of a component may reduce testing time. Additional or alternatively, the multi-variant component testing may reduce the number of errors or problems reported. For example, if all variants have the same error, individual testing may report the error for each variant, which may be unnecessary, whereas the multi-variant component testing may report a single error for all of the variants.

Figure 2:
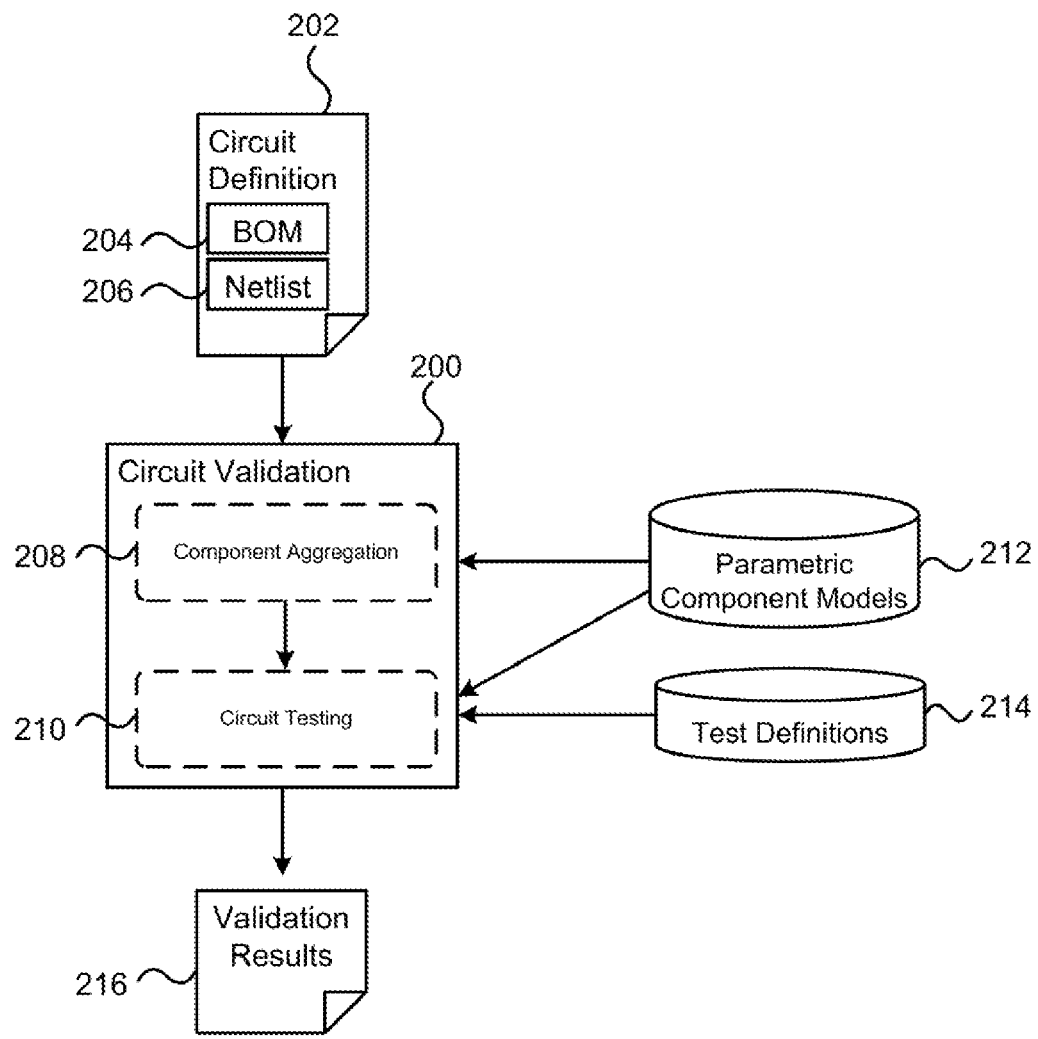
FIG. 2 depicts in a block diagram logical component of circuit validation functionality.

FIG. 2 depicts in a block diagram logical component of circuit validation functionality. The circuit validation functionality 200 may provide the component aggregation functionality 110 and circuit testing functionality 112 as described above with reference to FIG. 1. The circuit validation functionality 200 may receive a circuit definition 202. The circuit definition 202 fully describes a circuit board to be validated. The circuit definition 202 may include connection network definitions of a plurality of circuit components with respective pins connected together and indications of one or more electronic components providing each of the circuit components. The circuit definition 202 may be provided in various ways including through a Bill of Materials (BOM) 204 specifying the actual electronic components that may be used as the various circuit components and a netlist 206 specifying the interconnection of the circuit components as depicted. The BOM 204 associates a specific circuit component with an actual electrical component reference, or multiple electrical component references for multi-variant components. The netlist 206 specifies the specific connections between the circuit components using the component references of the BOM. For example, the netlist may specify that a component reference, U1, has its first pin connected to a first end of a resistor, R. The BOM may in turn specify the actual component associated with the component reference U1, for example using a manufacturer's part number or other identifying means, as well as the specific resistor value for R. In the case of multiple variants for the same circuit component, the BOM 204 may associate multiple electrical component references with the circuit component U1. The combination of the BOM 204 and the netlist 206 specify what all of the different components, and different component variants, of a circuit are and how they are connected together. The netlist 206 may specify the connection as a plurality of connection networks or nets. Each net specifies the component references, or more particularly pins of referenced components, that are connected together. For example, a first net may be specified as U1P1, U2P2 meaning that pin #1 of circuit component U1 is connected to pin #2 of component U2.

The circuit validation functionality 200 accesses the circuit definition 202 and processes it in order to determine and display the validation results. As depicted, the circuit validation functionality 200, may comprise component aggregation functionality 208 and circuit testing functionality 210. The functionality is described separately for the clarity of the description; however, it is contemplated that the various functionality may be combined together in various ways.

The component aggregation functionality 208 may access and process the BOM 204 in order to retrieve parametric models of each of the different variants of multi-variant components in the circuit and generate an aggregate component model. The parametric models of individual component variants may be retrieved from a database or similar structure 212 that stores a plurality of parametric models for the electrical components that may be encountered in circuit designs. A parametric model is associated with a particular electrical component, for example using a manufacturer's part number or other identifier used in the BOM to identify the specific electrical component. The aggregate component models may be stored to the parametric model database 212, or may be stored, either temporarily or permanently in other formats. Table 1 depicts an illustrative table that is representative of a possible parametric model that may be used to describe most components for the purpose of validating circuit design as described herein.

TABLE 1

| | | | | | | | | | | | | | |
|---|---|---|---|---|---|---|---|---|---|---|---|---|---|
| | | | | Illustrative Parametric Model | | | | | | | | | |
| Pin # | Pin Name | Pin Type | Input | | | | Output | | | | Driver Qualifier | Driver Power Rail | Power |
| | | | $V_{in}$ Max | $V_{in}$ High | $V_{in}$ Low | $V_{in}$ Min | $V_{out}$ Max | $V_{out}$ High | $V_{out}$ Low | $V_{out}$ Min | | | $V_{min}$  $V_{max}$ |

The component aggregation functionality 208 may retrieve the individual parametric models of the component variants and aggregate or combine the individual values of the different operating parameters together into a range of values. As depicted in Table 2 below, values in a parametric model, such as that of Table 1, may be split into high (H) and low (L) values providing the range of values for the combined variants of the component. As depicted in Table 2 below, not all of the parametric values will be split into a range of values since some of the parameters may provide a higher level description of the electrical component which will be the same for all of the different variants. For example, it is assumed that all of the different variants of a particular component would have the same pin types and pin numbering since the different variants still provide the same functionality. Other operating parameters may be modified in the aggregated parametric model to provide a range of operating parameter values. For example, the maximum and minimum input voltages may vary across the different variants and as such the aggregate parametric model may specify a range of values, depicted as a high and low value.

possible variants. As the circuit sizes and number of possible variants increase, the number of tests that would be required may become undesirably large.

Figure 4:
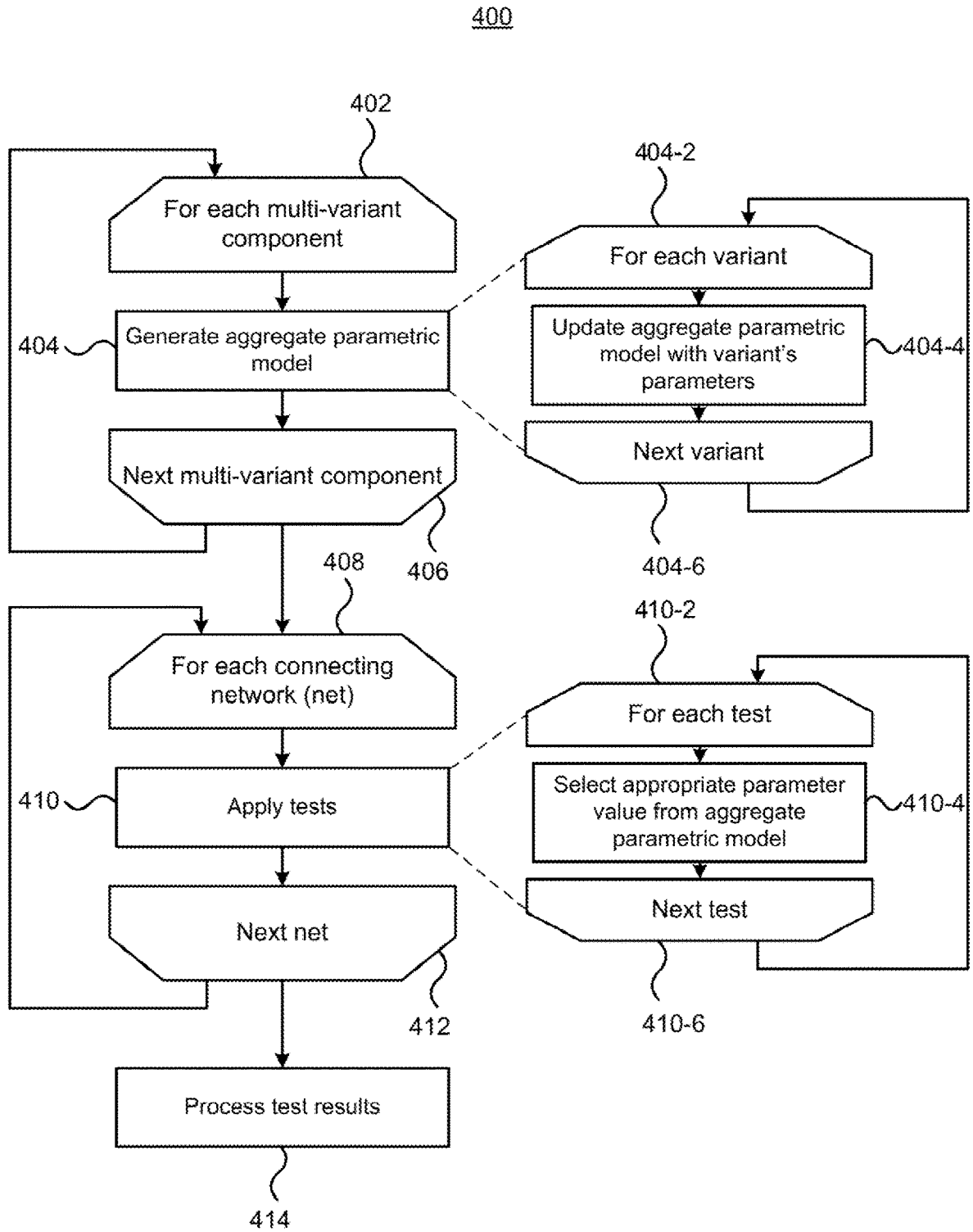
FIG. 4 depicts a method of validating a circuit comprising a plurality of different component variants.

FIG. 4 depicts a method of validating a circuit comprising a plurality of different component variants. The method 400 may be performed by circuit validation functionality, such as

TABLE 2

Illustrative Aggregate Component Model

| Pin # | Pin Name | Pin Type | Input | | | | | | | | Output | | | | | | | | Driver Qualifier | Driver Power Rail | Power | | | |
|---|---|---|---|---|---|---|---|---|---|---|---|---|---|---|---|---|---|---|---|---|---|---|---|---|
| | | | $V_{in}$ Max | | $V_{in}$ High | | $V_{in}$ Low | | $V_{in}$ Min | | $V_{out}$ Max | | $V_{out}$ High | | $V_{out}$ Low | | $V_{out}$ Min | | | | $V_{min}$ | | $V_{max}$ | |
| | | | H | L | H | L | H | L | H | L | H | L | H | L | H | L | H | L | | | H | L | H | L |

Once the aggregate component models of multi-variant components in the circuit definition are generated, they can be used, along with the parametric models of single variant components, or other multi-variant components, by test processing functionality 210.

The test processing functionality 210 may retrieve one or more tests to apply to the circuit, or a portion of the circuit being tested. The tests may be stored in a test definition database 214. The tests applied may be selected based on the portion of the circuit being tested, for example as described in U.S. Pat. No. 8,650,515 B2, which is incorporated herein by reference in its entirety. The tests may retrieve or access the appropriate value from the range when accessing an aggregate component model. For example, if the test verifies that a driving component can provide at least a sufficient driving voltage for all of the variants of a component, the test may select the high value of the range for the minimum input voltage. That is, if the driving component can supply an input value high enough for the variant that has the highest input voltage requirement. Similarly, if the test is to verify that the driving component will not provide too high of an input voltage, the low value of the range for the maximum input voltage may be selected. The circuit validation functionality 200 processes the circuit definition and generates validation results 216.

Figure 3:
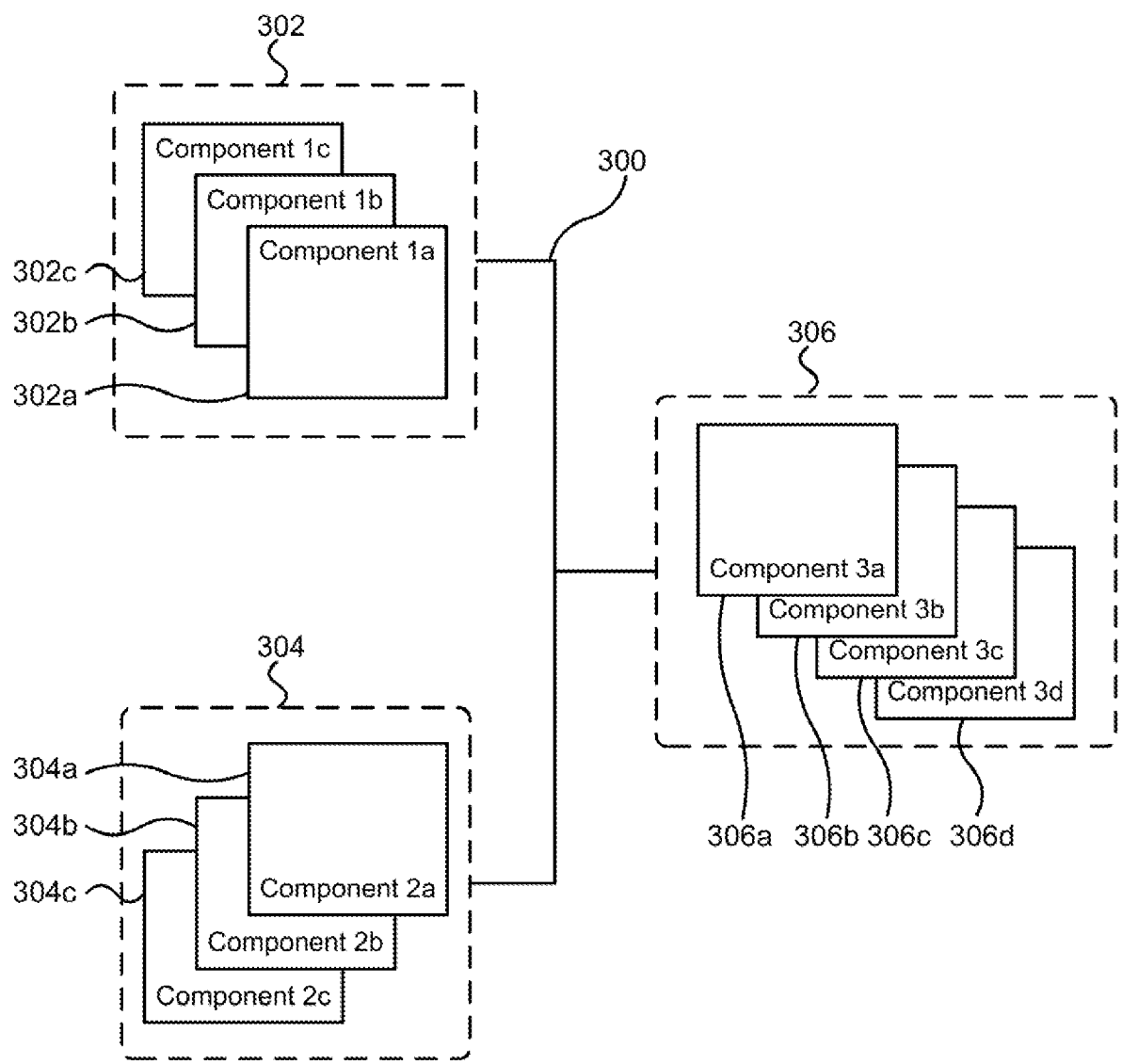
FIG. 3 depicts schematically a connection network of a circuit having multiple components, each with multiple variants.

FIG. 3 depicts schematically a connection network of a circuit having multiple components, each with multiple variants. The connection network, or net, 300 comprises a number of components 302, 304, 306 that are connected together. The net 300 is depicted as connecting three different multi-variant components together; however nets may connect both single variant components as well as multi-variant components. Although not depicted in FIG. 3, it will be appreciated that the net 300 connects pins of each of the components 302, 304, 306 together. As depicted, each of the components 302, 304, 306 may be provided by one of a plurality of possible variants. For example, component 302 may be provided by one of 3 possible variants 302a, 302b, 302c. Each of the variants may have substantially the same functionality and pin layouts and as such, one variant may be substituted for another; however, the variants may have minor differences in operating characteristics. As depicted the second component 304 may be provided by one of plurality of different variants 304a, 304b, 304c and the third component 306 may be provided by one of a plurality of different variants 306a, 306b, 306c, 306d. Without the use of the component aggregation functionality described herein, it would be necessary for the test processing functionality to test 3×3×4=36 different circuits in order to test each of the possible variants. As the circuit sizes and number of possible variants increase, the number of tests that would be required may become undesirably large.

the circuit validation functionality 200 described above. The method 400 may access a circuit definition that includes one or more multi-variant components. The processing of the circuit definition may identify the multi-variant components, and for each of the multi-variant component (402) the method generates an aggregate component model (404) and then proceeds to process the next multi-variant component (406). As depicted, in generating the aggregate parametric model each variant of the component (404-2) is processed in order to update the aggregate component model with the variant's parameters 404-4. The aggregate parametric model may be updated in various ways. For example, if one of the parameter's values is outside of the range of the aggregate component model, the range can be updated to include the value outside of the range. Accordingly, the value range covers all of the values of the individual component variants. Additionally or alternatively, if the operating parameter value of the individual component is provided as a range of values, the value range of the aggregate parametric model may be combined as the range of values common to all of the individual variants of the multi-variant component. Once the aggregate component model is updated, the next variant (404-6), may be processed.

Once the aggregate component models have been generated for the multi-variant components, each connecting network of the circuit is processed (408) and the tests are applied to the net (410). Once the tests are applied, the next net of the circuit is processed (412). As depicted, each of the tests (410-2) may select appropriate parameter values from the aggregate component model (410-4). The tests may also select or retrieve parameter values from the parametric component model for components that do not have multiple different variants. The next test (410-6) to apply to the net may be processed. Although depicted as being processed sequentially, it is possible to process the tests in parallel. Once the tests have been applied, the test results may be processed (414). The processing of the results may present the results in a manner suitable for an end user. For example, similar errors may be grouped together, the variant causing a particular error may be indicated, or other processing may be provided. The test results may be displayed to a user in various manners including as an error list, or within a circuit software design tool used in designing the circuit for example highlighting or annotating portions of the circuit where errors exist.

Embodiments within the scope of the present disclosure can be implemented in digital electronic circuitry, or in computer hardware, firmware, software configured hardware, or in combinations thereof. Instructions, possibly including program code, for configuring a computing system within the scope of the present disclosure can be stored on a computer program product tangibly embodied in a machine-readable non-transitory storage media. Such computer-readable non-transitory storage media may be any available non-transitory media, which is accessible by a general-purpose or special-purpose computer system. Examples of computer-readable storage media may include physical storage media such as RAM, ROM, EPROM, CD-ROM or other optical disk storage, magnetic disk storage or other magnetic storage devices, or any other media which can be used to carry or store desired program code means in the form of computer-executable instructions, computer-readable instructions, or data structures and which may be accessed by a general-purpose or special-purpose computer system.

Various specific details have been described above. While certain features or functionality may be described in particular detail with regard to one device or component, it will be appreciated that the functionality or features may be applied to other devices or components. While systems have been described Further, although various embodiments of the devices, equipment, functionality, etc. are described herein, the description is intended to provide an understanding of the systems, methods and devices and as such certain aspects may not be described, or not described in as much detail as other aspects. The described systems, methods and devices are not the sole possible implementations, and the various descriptions systems, methods and devices herein will enable one of ordinary skill in the art to apply the teachings to other equivalent implementations without exercising any inventive ingenuity.

What is claimed is:

1. A system comprising:
    a memory for storing instructions; and
    a processor for executing the instructions, which when executed configure the system to carry out a method comprising:
        accessing a circuit definition of a circuit design stored in memory of the computing system, the circuit definition comprising:
            connection network definitions of a plurality of circuit components with respective pins connected together; and
            indications of one or more electronic components providing each circuit component, each of the electronic components associated with an existing parametric model comprising at least one operating parameter and associated operating parameter value of the respective electronic component;
        identifying, as multi-variant circuit components, those circuit components within the circuit definition that are provided by a plurality of possible variant electronic components;
        for each multi-variant component, generating an aggregate parametric model for the multi-variant component from the respective parametric models associated with each of the plurality of possible variant electronic components;
        retrieving one or more circuit tests to apply to the circuit definition, each of the circuit tests defining operating parameters used by the respective circuit test; and
        applying the one or more circuit tests to the circuit definition of the circuit design using operating parameter values from aggregate parametric models for multi-variant components or operating parameter values from parametric models for circuit components.

2. The system of claim 1, wherein at least one of the one or more applied circuit tests identifies at least one potential issue in the circuit design, the memory storing instructions for further configuring the processor to prompt display results of applying the one or more circuit tests including the at least one identified potential issue in the circuit design.

3. The system of claim 2, further comprising a computer display, wherein the results are displayed within a circuit design tool displayed on the computer display.

4. The system of claim 1, wherein generating each of the aggregate parametric models for the multi-variant components comprises:
    combining operating parameter values from the respective parametric models of each of the plurality of possible variant electronic components of the respective multi-variant components together into a range of operating parameter values.

5. The system of claim 4, wherein combining operating parameter values together so that the highest operating parameter value of the plurality of respective parametric models is the highest operating parameter value of the operating parameter value range of the aggregate parametric model and the lowest operating parameter value of the plurality of respective parametric models is the lowest operating parameter value of the operating parameter value range of the aggregate parametric model.

6. The system of claim 4, wherein combining operating parameter values together so that the operating parameter value range of the aggregate parametric model comprises a range of common operating parameter values common to the plurality of respective parametric models.

7. The system of claim 4, wherein applying the one or more circuit tests comprises:
    selecting the operating parameter value to use in applying the respective test from the operating parameter value range of aggregate parametric model for multi-variant components.

8. The system of claim 7, wherein the one or more circuit tests provide an indication of an operating parameter value to select from the operating parameter value range.

9. The system of claim 8, wherein the indication of the operating parameter value is either the highest value of the operating parameter value range or the lowest value of the operating parameter value range.

10. The system of claim 1, wherein retrieving and applying the circuit tests to the circuit definition comprises retrieving and applying one or more circuit test to apply to each of the connection networks of the circuit definition.

11. A method comprising:
    accessing, by a computing system, a circuit definition of a circuit design stored in memory of the computing system, the circuit definition comprising:
        connection network definitions of a plurality of circuit components with respective pins connected together; and
        indications of one or more electronic components providing each circuit component, each of the electronic components associated with an existing parametric model comprising at least one operating parameter and associated operating parameter value of the respective electronic component;
    identifying, by the computing system, those circuit components within the circuit definition that are provided by a plurality of possible variant electronic components as multi-variant circuit components;

generating, by the computing system, an aggregate parametric model for each multi-variant component from the respective parametric models associated with each of the plurality of possible variant electronic components;

retrieving, by the computing system, one or more circuit tests to apply to the circuit definition, each of the circuit tests defining operating parameters used by the respective circuit test; and applying, by the computing system, the one or more circuit tests to the circuit definition of the circuit design using operating parameter values from aggregate parametric models for multi-variant components or operating parameter values from parametric models for circuit components.

12. The method of claim 11, wherein at least one of the one or more applied circuit tests identifies at least one potential issue in the circuit design, the method further comprising:

displaying, by the computing system, results of applying the one or more circuit tests including the at least one identified potential issue in the circuit design.

13. The method of claim 12, wherein the results are displayed within a circuit design tool on a computer display.

14. The method of claim 11, wherein generating each of the aggregate parametric models for the multi-variant components comprises:

combining operating parameter values from the respective parametric models of each of the plurality of possible variant electronic components of the respective multi-variant components together into a range of operating parameter values.

15. The method of claim 14, wherein combining operating parameter values together so that the highest operating parameter value of the plurality of respective parametric models is the highest operating parameter value of the operating parameter value range of the aggregate parametric model and the lowest operating parameter value of the plurality of respective parametric models is the lowest operating parameter value of the operating parameter value range of the aggregate parametric model.

16. The method of claim 14, wherein combining operating parameter values together so that the operating parameter value range of the aggregate parametric model comprises a range of common operating parameter values common to the plurality of respective parametric models.

17. The method of claim 14, wherein applying the one or more circuit tests comprises:

selecting the operating parameter value to use in applying the respective test from the operating parameter value range of aggregate parametric model for multi-variant components.

18. The method of claim 17, wherein the one or more circuit tests provide an indication of an operating parameter value to select from the operating parameter value range.

19. The method of claim 18, wherein the indication of the operating parameter value is either the highest value of the operating parameter value range or the lowest value of the operating parameter value range.

20. The method of claim 11, wherein retrieving and applying the circuit tests to the circuit definition comprises retrieving and applying one or more circuit test to apply to each of the connection networks of the circuit definition.

21. A non-transitory computer-readable medium storing a computer program product for use in generating an error report for validation of a test circuit, the computer program product comprising instructions, which when executed by a processor configure a computing system to carry out a method comprising:

accessing a circuit definition of a circuit design stored in memory of the computing system, the circuit definition comprising:

connection network definitions of a plurality of circuit components with respective pins connected together; and indications of one or more electronic components providing each circuit component, each of the electronic components associated with an existing parametric model comprising at least one operating parameter and associated operating parameter value of the respective electronic component;

identifying, as multi-variant circuit components, those circuit components within the circuit definition that are provided by a plurality of possible variant electronic components;

for each multi-variant component, generating an aggregate parametric model for the multi-variant component from the respective parametric models associated with each of the plurality of possible variant electronic components;

retrieving one or more circuit tests to apply to the circuit definition, each of the circuit tests defining operating parameters used by the respective circuit test; and applying the one or more circuit tests to the circuit definition of the circuit design using operating parameter values from aggregate parametric models for multi-variant components or operating parameter values from parametric models for circuit components.

* * * * *